United States Patent [19]

Stulting et al.

[11] 4,330,746
[45] May 18, 1982

[54] METHOD AND APPARATUS FOR MEASURING RECEIVED DOPPLER CYCLES FOR A SPECIFIED PERIOD OF TIME

[75] Inventors: Roy M. Stulting; Stanley W. Attwood, both of Scottsdale, Ariz.

[73] Assignee: Motorola Inc., Schaumburg, Ill.

[21] Appl. No.: 228,485

[22] Filed: Jan. 26, 1981

Related U.S. Application Data

[63] Continuation of Ser. No. 25,260, Mar. 29, 1979, abandoned.

[51] Int. Cl.[3] .............................................. G01R 23/02
[52] U.S. Cl. ............................... 324/78 D; 324/79 D; 328/140
[58] Field of Search ................ 324/79 D, 77 R, 78 D; 328/140, 141

[56] References Cited

U.S. PATENT DOCUMENTS 4,112,358 9/1978 Ashida .............................. 324/79 D

*Primary Examiner*—Michael J. Tokar
*Attorney, Agent, or Firm*—Eugene A. Parsons

[57] ABSTRACT

The Doppler is converted to digital or a square wave signal after which a first counter is used to count total full Doppler cycles by counting the positive going zero crossings, a second counter counts relatively high frequency pulses from the beginning of each cycle until the end or until the reception of a read-out pulse, whichever occurs sooner, and a third counter counts the high frequency clock pulses from the beginning of each cycle until the end. When the read-out pulse is received the partial Doppler cycle count in the second counter is divided by the full Doppler cycle count in the third counter to obtain a fraction indicative of the partial Doppler cycle, which fraction is added to the total full Doppler count in the first counter to obtain a measure of Doppler cycles from the start until the read-out pulse is received.

10 Claims, 1 Drawing Figure

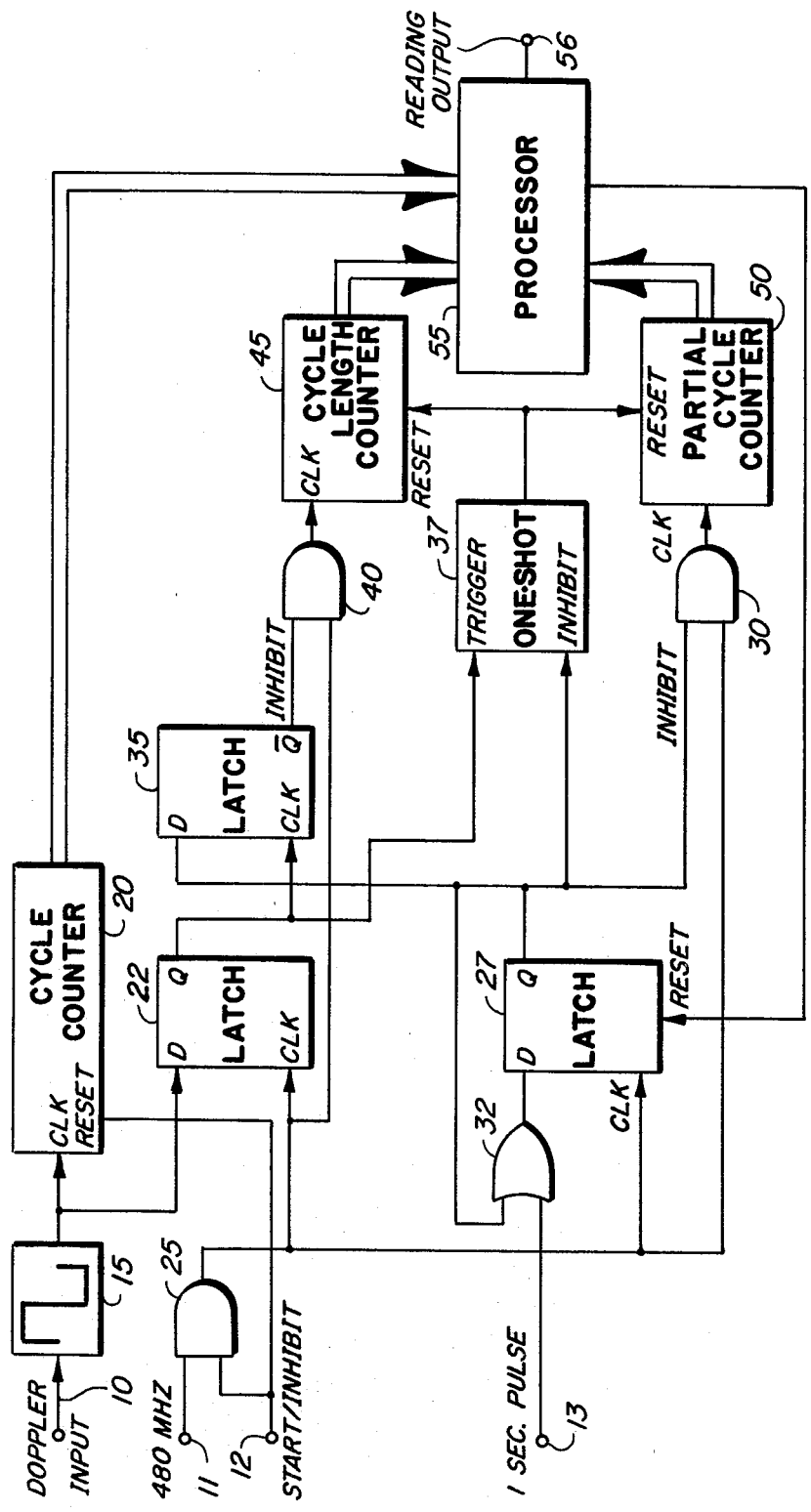

METHOD AND APPARATUS FOR MEASURING RECEIVED DOPPLER CYCLES FOR A SPECIFIED PERIOD OF TIME

This is a continuation of application Ser. No. 025,260, filed Mar. 29, 1979, and now abandoned.

BACKGROUND OF THE INVENTION

In conjunction with Doppler measurement equipment, it is sometimes essential to obtain extremely accurate measurements, which includes an exact indication of any partial Doppler cycles in the measurement. Prior art devices used analog multiplying techniques on the input signal (or the combination of several input signals) to increase the resolution of the Doppler measurement prior to digitizing the measurement. These analog multiplying techniques generally operated by applying the Doppler signal to a phase lock loop, or the like, to increase the frequency thereof. In general, using these prior art analog multiplying techniques required relatively complicated circuitry to obtain good resolution and, because of the tendency of the phase lock loop to lose the lock condition during the occurrence of noise, these prior art devices were relatively susceptible to noise. Also, because the prior art devices were relatively complicated they were also expensive.

SUMMARY OF THE INVENTION

The present invention pertains to a method and apparatus for measuring received Doppler cycles between a start time and a subsequent read-out time (designated by a specific pulse) including counting the full Doppler cycles between the start and read-out times, counting relatively high frequency pulses between the start of a final partial cycle and the read-out time defining the end of the final partial cycle, counting the relative high frequency pulses during a complete Doppler cycle adjacent the partial Doppler cycle, dividing the pulse count in the partial cycle by the pulse count in a complete cycle to provide a fraction indicative of the partial cycle and adding the fraction to the total count to obtain the total Doppler cycles between the start and the read-out times.

It is an object of the present invention to provide a new and improved method of measuring received Doppler cycles between a start time and a subsequent specific read-out time.

It is a further object of the present invention to provide new and improved apparatus for measuring received Doppler cycles between a start time and a subsequent specific read-out time, which apparatus includes digital counting techniques.

It is a further object of the present invention to provide a new and improved method of determining Doppler frequency by utilizing the improved method of measuring Doppler cycles.

These and other objects of this invention will become apparent to those skilled in the art upon consideration of the accompanying specification, claims and drawing.

BRIEF DESCRIPTION OF THE DRAWINGS

The single FIGURE is a simplified block diagram of Doppler cycle measurement apparatus embodying the present invention.

DESCRIPTION OF THE PREFERRED EMBODIMENT

In the FIGURE, four input terminals 10 through 13 are illustrated. Input terminal 10 is adapted to have applied thereto a Doppler input signal, which will appear as a sinusoidal wave and which is applied through a circuit 15 designed to convert the Doppler signal to a square wave of the same frequency. The circuit 15 may, for example, be an amplifier and limiting circuit, zero crossing detector and square wave generator, etc. The terminal 11 is adapted to receive a high frequency clock signal thereon, which in this embodiment is a 480 MHz signal. The input terminal 12 is adapted to receive start and/or inhibit signals thereon, which may be produced manually or by means of automatic circuitry and which indicates the start and stop of counting periods. The terminal 13 is adapted to receive measurement markers thereon, which markers may be applied at regular intervals such as the one second pulses disclosed herein, or pulses may simply be applied whenever a measurement is desired.

The Doppler signals from the squaring circuit 15 are applied to the clock input of a cycle counter 20 and to the D input of a latch circuit 22, which in this embodiment may be for example a D type flipflop. The cycle counter 20 and latch 22 are designed to operate only once per Doppler cycle and may be, for example, constructed to operate only on positive going pulses from the circuit 15, or the circuit 15 may produce only one pulse per Doppler cycle if convenient. The 480 MHz signal at the input terminal 11 is applied to one input of AND gate 25, the other terminal of which is connected to the input terminal 12. The start/inhibit signal on the input terminal 12 is also applied to a reset input of the cycle counter 20. Thus, when a start signal appears at the input terminal 12 480 MHz pulses appear at the output of the AND gate 25 and the cycle counter 20 is reset so that the count therein is a count of the full Doppler cycles from the start of the measurement.

The 480 MHz signals at the output of the AND gate 25 are applied to clock inputs of the latch circuit 22, a second latch circuit 27 on AND gate 40 and an AND gate 30. The one second interval mark pulses at the input terminal 13 are applied to one input of an OR gate 32, the output of which is applied to the D input of the latch circuit 27. The Q output of the latch circuit 27 is applied to a second input of the OR gate 32 so that each time a one second pulse is applied to the terminal 13 and a 480 MHz clock pulse appears at the clock input of the circuit 27, the circuit 27 is latched with a signal at the Q output thereof until a reset signal is applied thereto. The latch circuits 22 and 27 are essentially included herein to synchronize the Doppler signals with the 480 MHz clock pulses and to synchronize the one second interval marker pulses with the 480 MHz clock pulses, respectively. The latch circuit 27 also prevents operation of additional circuits to be described presently for a desired period of time subsequent to a one second interval marker pulse.

The Q output of the latch circuit 22 is connected to a clock input of a latch circuit 35, which circuit is similar to the circuits 22 and 27. The Q output of the latch circuit 22 is also connected to a trigger input of a one shot multivibrator circuit 37. While a one shot multivibrator circuit 37 is specified, it will be understood by those skilled in the art that many other types of circuits might be utilized to perform the functions to be disclosed and the one shot multivibrator is specified only because of its simplicity and availability. The Q output of the latch circuit 27 is applied to the D input of the latch circuit 35, to an inhibit input of the one shot multivibrator 37 and to a second input of the AND gate 30. The Q output of the latch circuit 35 is connected to one input of an AND gate 40, a second input of which is connected to receive 480 MHz pulses from the output of the AND gate 25. The output of the AND gate 40 is connected to the clock input of a cycle length counter 45. The output of the AND gate 30 is connected to the clock input of a partial cycle counter 50. The output of the one shot multivibrator circuit 37 is connected to reset inputs of both the cycle length counter 45 and the partial cycle counter 50. Outputs from the cycle counter 20, the cycle length counter 45 and the partial cycle counter 50 are applied to a processor 55. The outputs from the three counters 20, 45 and 50 are applied to the processor 55 in parallel, or each input is applied by means of a plurality of lines, which fact is indicated by the dual lines illustrated in the FIGURE. In the present embodiment, for example, the output of the cycle counter 20 is applied to the processor 55 on 34 lines, the output of the cycle length counter 45 is applied to the processor on 16 lines and the output of the partial cycle counter 50 is appled to the processor 55 on 16 lines. The output of the processor 55 is available at a terminal 56 which terminal may be connected to an indicator or additional equipment for using the measurement reading. An output from the processor 55 is connected to the reset input of the latch circuit 27. A signal appears at this output whenever the processor 55 has completed a reading.

In the operation of the circuit illustrated, the cycle counter 20 is reset by a start signal on the terminal 12 and counts full Doppler cycles, which count is applied to the processor 55. The Doppler cycles are synchronized with the 480 MHz clock pulses in the latch circuit 22 and are used to trigger the one shot multivibrator 37. Each time the one shot multivibrator 37 is triggered by a Doppler signal, an output pulse is supplied to reset both of the counters 45 and 50. Thus, neither of the counters 45 or 50 count longer than a single Doppler cycle. The 480 MHz clock pulses are supplied to the counters 45 and 50 through the AND gates 40 and 30, respectively, so that each of the counters 45 and 50 count 480 MHz clock pulses as long as they are supplied to the clock inputs thereof or until the counters are reset.

When a one second interval marker pulse appears at the input terminal 13 the latch circuit 27 latches so that a signal appears at the output thereof until a signal is applied to the reset input. The signal at the output of the latch circuit 27 is applied to the one shot multivibrator circuit 37 to inhibit operation thereof so that the counters 45 and 50 cannot be reset by the next Doppler pulse. Also, the output of the latch circuit 27 is applied to the AND gate 30 to inhibit the operation thereof so that 480 MHz clock pulses are prevented from being applied to the partial cycle counter 50 as soon as a one second marker pulse appears at the input terminal 13. In addition, the output signal of the latch circuit 27 is applied to the D input of the latch circuit 35 which produces an output as soon as the next Doppler signal is applied to the clock input thereof. The output signal from the latch circuit 35 is applied to the input of the AND gate 40 to inhibit the operation thereof and prevent 480 MHz clock pulses from being applied to the cycle length counter 45. Thus, 480 MHz clock pulses are applied to the counter 45 for the full length of a Doppler cycle adjacent (in time) the occurrence of a one second interval marker pulse. The partial cycle counter 50 counts 480 MHz clock pulses between the one second interval marker pulse and the previous positive going (or leading edge) portion of the Doppler cycle (the last full Doppler cycle, between the start and read-out time). The count of the number of 480 MHz clock pulses in the full Doppler cycle adjacent the one second interval marker pulse is supplied from the cycle length counter 45 to the processor 55. The count of 480 MHz clock pulses in the portion of a Doppler cycle ending with the one second interval marker pulse is supplied from the partial cycle counter 50 to the processor 55. The processor 55 divides the partial cycle count from the counter 50 by the cycle length count from the counter 45 to obtain a fraction indicative of the portion of a Doppler cycle between the last full Doppler cycle and the occurrence of the one second interval marker pulse. This fraction is added to the full Doppler cycle count from the counter 20 to produce an accurate reading of the number of Doppler cycles from the start of the counting period until the occurrence of the one second interval marker. If a second Doppler reading is taken a known period of time later, for example one second, the first reading may be subtracted from the second reading to obtain an exact count of Doppler cycles which occurred during the interval. From this exact count the Doppler frequency can be calculated very accurately. While the present circuit counts Doppler cycles from a start pulse to a second interval marker pulse, it will be understood by those skilled in the art that the operation might also be constructed to read Doppler cycles between one second interval marker pulse or any other pulse supplied.

If the approximately maximum and minimum Doppler frequencies to be measured are known and a specific accuracy is desired, the frequency of the clock pulses applied to the input terminal 11 can be calculated. For example, if an accuracy of 0.001 of a cycle is desired the frequency of the clock pulses applied to the input terminal 11 should be at least 1000 times as great as the maximum Doppler frequency expected. Thus, the count in the cycle length counter 45 will never be less than 1000. In some instances, the one second interval marker pulse may occur close enough to the beginning of a Doppler cycle to cause a possible ambiguity in the count. To prevent such ambiguities the Doppler cycles are synchronized with the clock pulses in the latch circuit 22 and the one second interval marker pulses are synchronized with the clock pulses the latch circuit 27. This synchronization of the various pulses is one method of preventing ambiguities in the final count reading but other methods might be devised by those skilled in the art and this method is simply illustrated for exemplary purposes. Further, the various specific circuits illustrated may be replaced by those skilled in the art with one or more circuits which perform the same functions. Thus, a new and improved method and apparatus for measuring received Doppler cycles is illustrated and disclosed, which method and apparatus is, or may be, extremely accurate and is capable of measuring partial Doppler cycles extremely accurately.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. A method of measuring received Doppler cycles between a start time and a subsequent specific read-out time comprising the steps of:
   (a) counting the total number of full Doppler cycles between the start and read-out times;
   (b) providing a relatively high frequency source of clock pulses;
   (c) counting the number of clock pulses in any partial Doppler cycle occurring between the last full Doppler cycle, between the start and read-out time, and the read-out time;
   (d) counting the number of clock pulses in a known portion of a Doppler cycle adjacent the partial Doppler cycle and determining therefrom the number of clock pulses in a full Doppler cycle;
   (e) dividing the count of clock pulses in the partial Doppler cycle by the count of clock pulses in the full Doppler cycle to obtain a fraction representing the partial Doppler cycle; and
   (f) adding the fraction to the total number of full cycles to obtain a measure of received Doppler cycles between start and read-out times.

2. A method as claimed in claim 1 including the step of synchronizing the clock pulses with the start time and the read-out time to prevent ambiguities in the final measure.

3. A method as claimed in claim 1 wherein the known portion of a Doppler cycle is a complete Doppler cycle.

4. A method of determining Doppler frequency comprising the step of:
   (a) providing a relatively high frequency source of clock pulses;
   (b) making a first measurement of received Doppler cycles between a start time and a subsequent first read-out time including the steps of,
      1. counting the total number of full Doppler cycles between the start and first read-out times,
      2. counting the number of clock pulses in any partial Doppler cycle occurring between the last full Doppler cycle, between the start and first read-out times, and the first read-out time,
      3. counting the number of clock pulses in a known portion of a Doppler cycle adjacent the partial Doppler cycle and determining therefrom the number of clock pulses in a full Doppler cycle,
      4. dividing the count of clock pulses in the partial Doppler cycle by the count of clock pulses in the full Doppler cycle to obtain a fraction representing the partial Doppler cycle, and
      5. adding the fraction to the total number of full cycles to obtain a measure of received Doppler cycles between the start and first read-out times;
   (c) making a second measurement of received Doppler cycles between the start time and a second read-out time a known period of time subsequent to the first read-out time including the steps of,
      (1) counting the total number of full Doppler cycles between the start and second read-out times,
      (2) counting the number of clock pulses in any partial Doppler cycle occurring between the last full Doppler cycle, between the start and second read-out times, and the second read-out time,
      (3) counting the number of clock pulses in a known portion of a Doppler cycle adjacent the partial Doppler cycle and determining therefrom the number of clock pulses in a full Doppler cycle,
      (4) dividing the count of clock pulses in the partial Doppler cycle by the count of clock pulses in the full Doppler cycle to obtain a fraction representing the partial Doppler cycle, and
      (5) adding the fraction to the total number of full cycles to obtain a measure of received Doppler cycles between the start and second read-out times; and
   (d) subtracting the first and second measurements to obtain the Doppler cycles received during the known period of time between the first and second read-out times and calculating the Doppler frequency for the known period of time.

5. Apparatus for measuring received Doppler cycles comprising:
   (a) first counting means connected to receive the Doppler cycles and providing an output signal indicative of the number of full Doppler cycles received;
   (b) a source of relatively high frequency clock pulses;
   (c) second counting means connected to respond to the Doppler cycles, the clock pulses and a read-out signal for being reset by each Doppler cycle and counting the clock pulses from reset until reception of the read-out signal;
   (d) third counting means connected to respond to the clock pulses, the Doppler cycles and the read-out signal for being reset by each Doppler cycle and counting the clock pulses between resets;
   (e) dividing means connected to receive the clock pulse counts from the second and third counting means and to divide the clock pulse output of the second counting means by the clock pulse output of the third counting means to provide an output signal indicative of any partial Doppler cycle received between the final complete Doppler cycle prior to the read-out signal and the read-out signal; and
   (f) combiner means connected to receive the output signal of the first counting means and the output signal of the dividing means and combine the signals to provide an output signal indicative of the total count of Doppler cycles received.

6. Apparatus as claimed in claim 5 wherein the first counting means is constructed to count zero crossings.

7. Apparatus as claimed in claim 6 wherein the first counting means is constructed to count only positive going zero crossings of the Doppler cycles and the second and third counting means are reset by only the positive going zero crossings.

8. Apparatus as claimed in claim 7 wherein the read-out signal is long enough to coincide with at least one positive going zero crossing of the Doppler cycles and the third counter is connected to hold the clock pulse count between the time of the coincidence between the one positive going zero crossing and the read-out signal and the time of the previous positive going zero crossing.

9. A method of measuring the number of whole and partial, received variable length cycles between a start time and a subsequent specific read-out time comprising the steps of:
   (a) counting the total number of full cycles between the start and read-out times;

(b) providing a relatively high frequency source of clock pulses;

(c) counting the number of clock pulses in any partial cycle occurring between the last full cycle, between the start and read-out time, and the read-out time;

(d) counting the number of clock pulses in a known portion of a cycle adjacent the partial cycle and determining therefrom the number of clock pulses in a full cycle;

(e) dividing the count of clock pulses in the partial cycle by the count of clock pulses in the full cycle to obtain a fraction representing the partial cycle; and (f) adding the fraction to the total number of full cycles to obtain a measure of the number of whole and partial cycles between start and read-out times.

10. Apparatus for measuring the number of whole and partial, received variable length cycles comprising:

(a) first counting means having a connection for receiving variable length cycles and providing an output signal indicative of the number of full cycles received;

(b) a source of relatively high frequency clock pulses;

(c) second counting means connected to respond to the cycles, the clock pulses and a read-out signal for being reset by each cycle and counting the clock pulses from reset until reception of the read-out signal;

(d) third counting means connected to respond to the clock pulses, the cycles and the read-out signal for being reset by each cycle and counting the clock pulses between resets;

(e) dividing means connected to receive the clock pulse counts from the second and third counting means and to divide the clock pulse output of the second counting means by the clock pulses output of the third counting means to provide an output signal indicative of any partial cycle received between the final complete cycle prior to the reading signal and the read-out signal; and (f) combiner means connected to receive the output signls of the first counting means and the output signal of the dividing means and combine the signals to provide an output signal indicative of the total count of cycles received.

* * * * *